United States Patent [19]
Dorri et al.

[11] Patent Number: 4,956,608
[45] Date of Patent: Sep. 11, 1990

[54] APPARATUS FOR PROPAGATING A QUENCH IN A SUPERCONDUCTING MAGNET

[75] Inventors: Bizhan Dorri, Clifton Park; Dan A. Gross, Schenectady; Lembit Salasoo, Delanson, all of N.Y.

[73] Assignee: General Electric Company, Schenectady, N.Y.

[21] Appl. No.: 345,333

[22] Filed: May 1, 1989

[51] Int. Cl.⁵ ............................................. G01R 33/20
[52] U.S. Cl. .................................... 324/319; 335/216; 335/299; 324/318
[58] Field of Search ............... 335/216, 299; 324/300, 324/307, 309, 318, 319, 320, 322; 361/19, 139, 140, 141; 307/306, 491

[56] References Cited

U.S. PATENT DOCUMENTS

| | | | |
|---|---|---|---|
| 3,336,549 | 8/1967 | Kafka | 335/216 |
| 4,055,847 | 10/1977 | Fletcher | 307/306 |
| 4,271,443 | 1/1981 | Nother | 307/306 |
| 4,375,659 | 3/1983 | Cunningham | 307/306 |

*Primary Examiner*—Michael J. Tokar
*Attorney, Agent, or Firm*—William H. Steinberg; James C. Davis, Jr.

[57] ABSTRACT

In one aspect of the present invention a superconductive magnet for use in a magnetic resonance imaging and spectroscopy is provided. The magnet comprises a cylindrical coil form having a plurality of superconductive coils situated coaxially on the cylinder, spaced apart from one another. A plurality of pairs of thermal bridges each comprising a bar shaped section connecting a first and second end portion is also provided. The first end section has a greater surface are than the second end section. Each of the pairs of thermal bridges is situated between a respective pair of adjacent coils. The bar section of each of the thermal bridges extends axially between the adjacent coils. In each pair, the first end of one of the pair and the second end of the other of the pair are in thermal contact with one of the adjacent coils, the second end of one of the pair and the first end of the other of the pair are in thermal contact with the other coil of the adjacent pair. Each of the thermal bridges act as a heat flux amplifier in an opposite direction between the adjacent coils due to different end portion areas in contact with the adjacent coils.

23 Claims, 3 Drawing Sheets

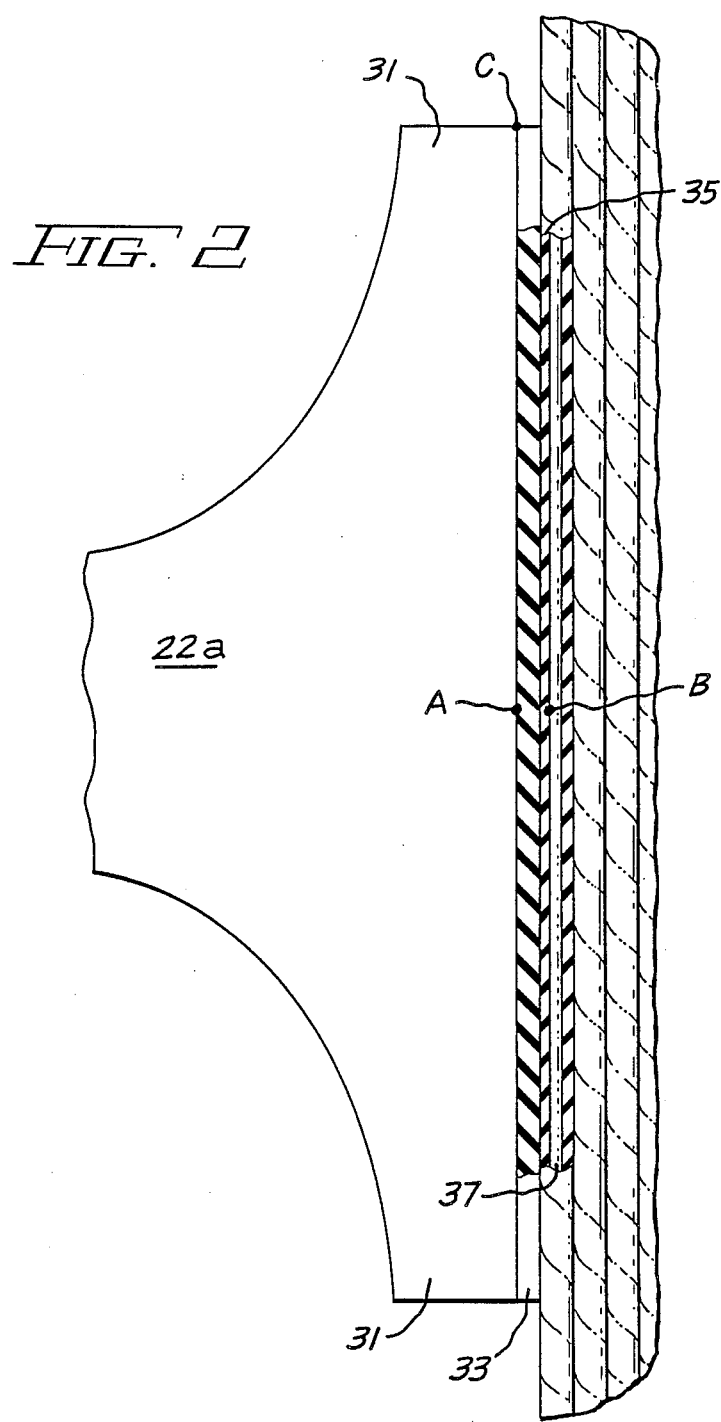

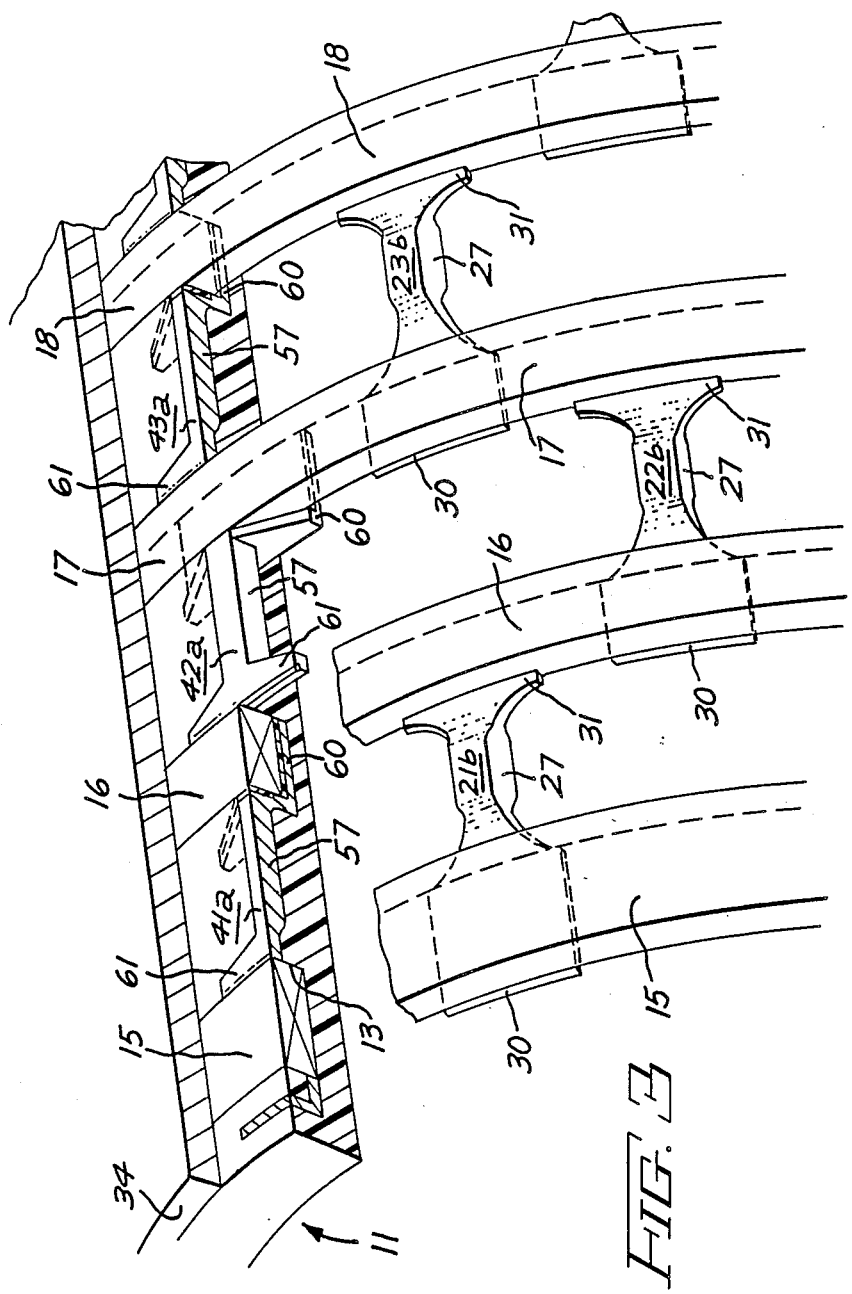

APPARATUS FOR PROPAGATING A QUENCH IN A SUPERCONDUCTING MAGNET

BACKGROUND OF THE INVENTION

The present invention relates to apparatus for thermally propagating a quench in a multicoil magnet from the initially quenched coil to all the other coils.

A superconducting magnet having several coils can, during operation, have a portion of one of the coils change from the superconducting state to the normal state due to a temperature rise resulting from local heating caused by wire movement or insufficient cooling. A quench of the coil occurs if the entire coil transitions to the normal state. Quenching can also occur during powering up of the magnet due to changing field strengths caused by increasing currents. Loss of the superconducting state at one location in a coil where the superconductive wire or tape presents resistance to the current flow usually is followed by a quench of the entire coil. During the quench, all the magnetic energy stored in the circulating currents of the magnet are then dissipated as thermal energy.

A quench is a fast transient and high energy phenomenon which can cause permanent damage to superconductive coils due to the resultant thermal and electrical stresses. Every superconducting magnet needs to be designed so that it can withstand a quench without causing damage to the magnet wiring, allowing the magnet to be repowered and used again.

In a series connected multicoil magnet system, if no active or passive protection system is provided, all of the energy of the magnet can be dissipated in the quenched coil resulting in an excessive temperature rise, damaging the quenched coil. It is desirable to distribute the stored magnetic energy among all the coils by initiating a quench in the other coils when a quench is detected in one coil. Quench propagation is presently achieved by electrical and magnetic coupling, designed so that the rising resistance of the quenching coil induces heating and/or increases the current in the other coils, which eventually initiates a quench in those coils.

It is an object of the present invention to provide apparatus for propagating a quench from one quenching coil to other nonquenched coils by heat conduction without relying on electrical or magnetic coupling.

SUMMARY OF THE INVENTION

In one aspect of the present invention a superconductive magnet for use in a magnetic resonance imaging and spectroscopy is provided. The magnet comprises a cylindrical coil form having a plurality of superconductive coils situated coaxially on the cylinder, spaced apart from one another. A plurality of pairs of thermal bridges each comprising a bar shaped section connecting a first and second end portion is also provided. The first end section has a greater surface area than the second end section. Each of the pairs of thermal bridges is situated between a respective pair of adjacent coils. The bar section of each of the thermal bridges is aligned with the magnet's field between the adjacent coils. In each pair, the first end of one of the pair and the second end of the other of the pair are in thermal contact with one of the adjacent coils, the second end of one of the pair and the first end of the other of the pair are in thermal contact with the other coil of the adjacent pair. Each of the thermal bridges act as a heat flux amplifier in an opposite direction between the adjacent coils due to different end portion areas in contact with the adjacent coils.

In another aspect of the present invention one of the thermal bridges in each pair is also electrically connected at each end to an end of each of the adjacent coils so that the thermal bridge also serves as a bus bar electrically connecting the coils together.

BRIEF DESCRIPTION OF THE DRAWING

The subject matter which is regarded as the invention is particularly pointed out and distinctly claimed in the concluding portion of the specification. The invention, however, both as to organization and method of practice, together with further objects and advantages thereof, may best be understood by reference to the following description taken in conjunction with the accompanying drawing figures in which:

FIG. 2 is partial top view showing a detail of FIG. 1; and

FIG. 3 is a partial isometric view partly in section of superconductive coils wound on a coil form with another embodiment of the apparatus for propagating a quench in accordance with the present invention.

DETAILED DESCRIPTION OF THE INVENTION

Figure 1:
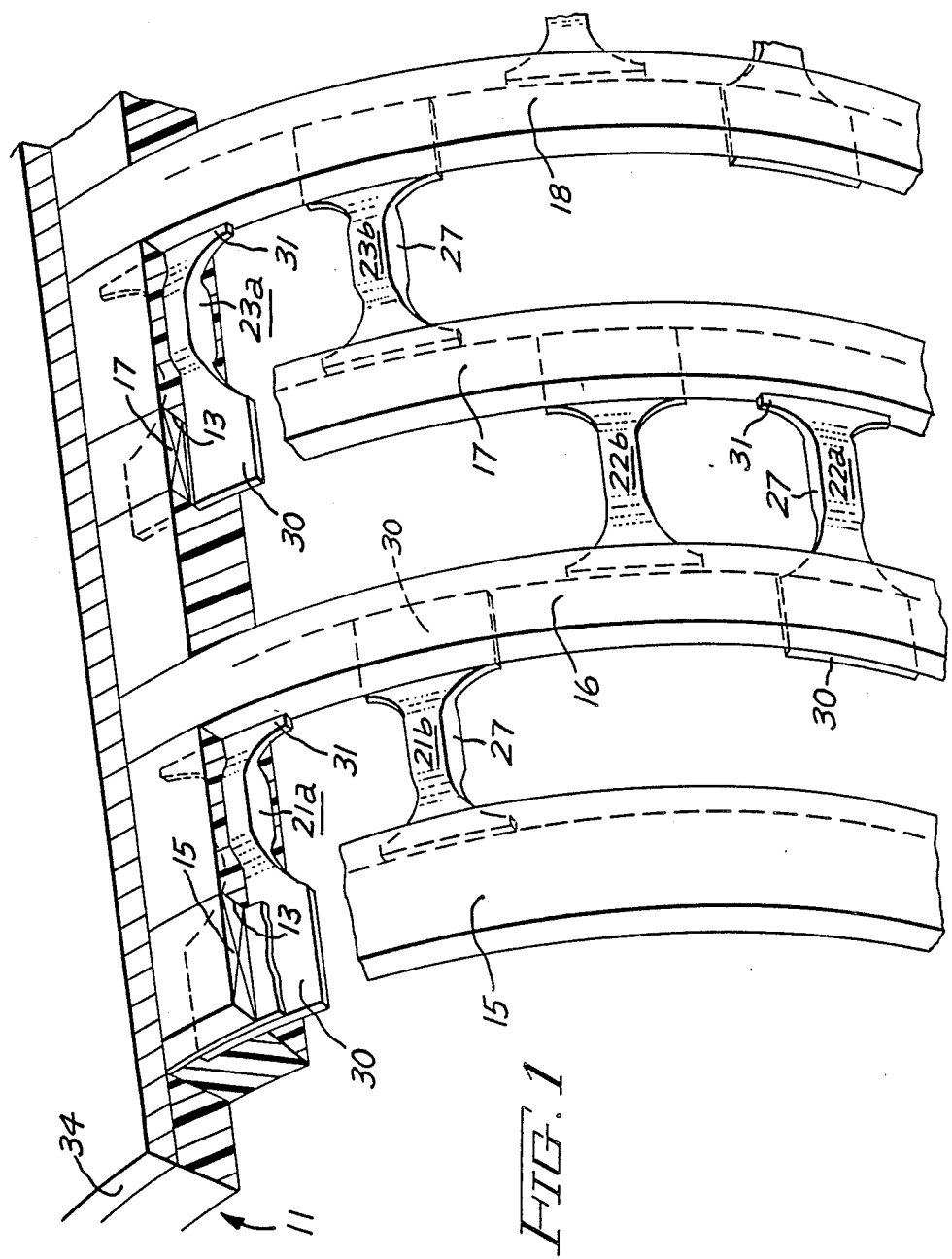
FIG. 1 is a partial isometric view partly in section of superconductive coils wound on a coil form with apparatus for propagating a quench in accordance with the present invention.

Referring now to the drawing wherein like numerals indicate like elements throughout and particularly FIG. 1 thereof, a portion of a cylindrical fiberglass shell 11 having circumferential grooves 13 in which superconductive wire is wound to form separate coils 15, 16, 17 and 18, is shown. In order to propagate a quench from one coil to the next coil in a short period of time, relative to the time it takes the quench to propagate through a single coil, thermal bridges 21a and b, 22a and b, and 23a and b are used to conduct heat from one quenching coil to another coil with thermal bridges 21a and b, 22a and b, and 23a and b situated between coils 15 and 16, 16 and 17, and 17 and 18, respectively. The thermal bridges comprise a bar region 27 with a reduced surface to volume ratio with a rectangular cross section shown for fabrication convenience but having a circular cross section for minimum heat loss. The edges of the rectangular cross section bar can be beveled to reduce the cross sectional area. The bar region preferably is aligned with the magnet's field which in the present embodiment extends axially. Therefore the bar region extends axially between adjacent coils. The ends of the bar region 30 and 31 have a greater surface area and reduced thickness compared to the bar region. The increased surface area ends of the thermal bridge are in thermal contact with adjacent coils through electrical insulation of the thermal bridge to avoid electrically connecting adjacent coils. The thermal bridges are located in slots machined in the fiberglass form.

The material used to fabricate the thermal bridges should have high thermal diffusivity at low temperatures. A high thermal diffusivity material has high thermal conductivity and low specific heat with thermal diffusivity "a" defined by the ratio $$a = K/(C \times D)$$

where K is the thermal conductivity, C is specific heat and D is density. The time T it takes for heat to flow from one point to the next is approximately defined as $$T = L^2/2a$$

where, L is the distance the heat traveled and a is the thermal diffusivity. Suitable materials with high thermal diffusivity at low temperatures are high purity copper, silver and high purity aluminum. The preferred directions of thermal diffusivity in a magnetic field can be utilized to enhance the thermal bridge action by aligning the bar section with the magnet's field. In a superconductive magnet used for magnetic resonance imaging and spectroscopy the magnetic field is in the axial direction.

The thermal bridges are covered with epoxy resin and glass and the entire form epoxy impregnated. The thermal bridges are treated to enhance their bonding to the epoxy resin. When copper bridges are used an EBONOL blackening process can be used. The coil form is enclosed by a heat conductive shell 34 which can be fabricated from copper as disclosed in copending application entitled "Superconductive Quench Protected Magnet Coil", Ser. No. 07/215,479 and hereby incorporated by reference. The coil windings typically have electrical insulation, such as epoxy and glass cloth, to insulate the windings from one another and to keep the windings from moving when in the presence of forces created by the magnetic field of the magnet. A low thermal resistance through the heat conducting path between the windings and the contact area at the ends of the thermal bridge is important to quickly transfer as much heat as possible. However, sufficient insulation has to be added between the ends of the thermal bridges and the windings to provide insulation to protect against the voltage differences which arise during rampup and during a quench. A thickness of 5–10 mils of fibrous cloth and epoxy should provide adequate electrical insulation. The areas of the two ends of each of the thermal bridges in thermal contact with the adjacent coils are different. The thermal bridge needs a large contact area 30 with the quenching coil to maximize heat input to the thermal bridge. The non-quenched coil is at a low temperature and acts as a good thermal sink. Therefore a small contact area 31 with the coil to be quenched insures more local heating and decreases the total energy required to raise the local temperature of a section of the nonquenched coil to initiate a quench. The large contact area 30 is shown in thermal contact underneath the coil in the embodiment of FIG. 1. The small contact area 31 is shown in contact with the edge of the coil. The heat transfer rates into and out of a thermal bridge are equal and since the input area exceeds the output area, the thermal bridge acts as an amplifier of heat flux, in the preferred direction from the large area input to the small contact area output. Since it is not known which of two adjacent coils will quench first, the thermal bridges are installed in pairs each having an opposite amplification direction.

Referring now to FIG. 2, the circumferential distance the thermal bridge extends adjacent to a superconductive coil for delivering heat from the quenching coil to the unquenched coil is selected to maximize energy transfer. The circumferential extent of end 31 is selected so that the length of time it takes for heat to go from the center of the thermal bridge shown as point A in FIG. 2, across the insulation 33 and the insulation of the superconductive wire 35 separating the end of the bridge from the superconductive wire 37 at point B is the same time it takes the heat to go from point A to point C at the circumferential end of the thermal bridge. The circumferential extent of the large area end 30 can be selected by an analogous procedure so that the length of time it takes for heat to go radially from the center of the thermal bridge input end across the intervening insulation to the superconducting wire is the same time it takes the heat to go circumferentially from the center to the edge of the thermal bridge input end.

In operation, when one coil begins to quench, heat is transmitted from the quenching coil to the adjacent coils (to just one coil if an end coil quenches first) by the thermal bridges. If, for example, coil 16 were to quench, thermal bridge 21b would pick up heat in its large area end 30 which is situated beneath the coil and conduct the heat to the superconducting wires at the edge of adjacent coil 15, heating the wires in the vicinity of the end of the thermal bridge. Similarly thermal bridge 22a would conduct heat received by the large area end beneath coil 16 across the bar region to the small area end 31 in contact with the edge of coil 17. The heat transmitted is sufficient to raise a portion of one or two wires of the adjacent coil above their critical temperatures, the current flowing through the wire causes additional heating due to $I^2R$ losses. The rest of the coil heats up and begins to quench. The time for the heat to cross from the wire of a quenched coil to the wire of an unquenched coil has been calculated to be approximately 10 milliseconds. The time for the coil to quench is less than a second. Thermal bridges 21a and 22b also conduct heat from the quenching coil to the adjacent coils. Since these thermal bridges have their smaller cross sectional area end in contact with the quenching coil the heat flux is delivered over a wider area by the large area end and these thermal bridges do not contribute to quench propagation in this example.

FIG. 3 shows another embodiment of the present invention. Thermal bridge pairs 41a and 21b, 42a and 22b, and 43a and 23b are shown between adjacent coils 15 and 16, 16 and 17 and 17 and 18, respectively. The coils are wound in circumferential grooves 13 as described in connection with FIG. 1. One of the thermal bridges in each of the pairs 41a, 42a and 43a serves the additional function of a bus bar to electrically connect the superconductive coils 15, 16, 17 and 18 in series. The thermal bridges are fabricated from high purity aluminum, high purity silver or high purity copper as before and are not superconductive. The combination bus bar thermal bridges 41a, 42a and 43a each has a central bar region 57 with a rectangular cross section for ease of fabrication although a circular cross section will minimize heat loss to the surrounding coil form. The area of the ends 60 and 61 of the thermal bridge in contact with the adjacent coils are unequal with the winding termination of one coil being soldered to a circumferentially extending end of the thermal bridge having the smaller cross sectional area 61 in contact with the coil. The larger cross sectional area end of the thermal bridge extends alongside the edge and under the other adjacent coil with the initial winding of the coil soldered along a circumferentially extending portion of the bus bar.

While the ending and starting turns of adjacent coils are in direct electrical contact with the thermal bridge, other turns in addition to being electrically insulated from one another have additional insulation between the coil and the ends of the thermal bridge. Since the thermal bridges 41a, 42a and 43a join two adjacent coils the voltage difference between the end portions are reduced to a negligible value. The electrical insulation needed between the end portion and the coils which normally is required to withstand quench voltages of up to 3 kV can be greatly reduced to approximately 300 V. The solder joint between the conductor and the circumferentially extending end portions provides an excellent thermal connection to the bridge. The heat collecting surface and distributing surfaces at the ends of the thermal bridge can have a different circumferential length than the lead connecting surface. The use of the reduced insulation thickness between the ends of the combination thermal bridge and bus bar and the coils enhances the thermal bridge heat transferring ability because the thermal impedance has been reduced.

The other thermal bridge in each of the pairs, 21b, 22b and 23b, is as previously described in connection with FIG. 1 and has a preferential heat flux conduction in a direction opposite to the combination thermal bridge and bus bars 41a, 42a and 43a. The circumferential extent for the bridges is determined as discussed above. In operation the combination thermal bridge and bus bar has a preferred heat flux amplification direction from the large area end to the small area end. The direct electrical contact enhances thermal transfer between coils.

While only a pair of thermal bridges have been shown between adjacent coils, two pairs of thermal bridges could be used with the thermal bridge having the same preferential flux conducting direction spaced 180° from one another, for example. If multiple pairs of thermal bridges are used, only one thermal bridge between adjacent coils would be a combination thermal bridge and bus bar in the implementation of embodiment shown in FIG. 3.

Contact between the ends of thermal bridges and the coils can be made between the edges of the coils or underneath the coils based on manufacturing convenience and the forces exerted on the coils and bus bars during magnet operation.

The thermal bridges are shown in both embodiments with a winding form which is cooled by a cryocooler (not shown). The thermal bridges can also be used with coils cooled by liquid helium and helium vapor. When the coils are cooled by liquid helium, the thermal bridges should be situated in a position on the coil form that is not immersed in the liquid helium.

Other quench protection schemes can be used in combination with the present invention such as the use of continuous loops of copper coil surrounding layers of winding in the coil as shown in copending application Ser. No. 07/215,479 and assigned to the instant assignee and also the use of heaters embedded in the coils which are operated by the voltages induced across the quenching coil to which the heaters are coupled.

The foregoing has described apparatus for propagating a quench from one quenching coil to the non-quenched coils by heat conduction without relying on electrical or magnetic coupling.

While the invention has been particularly shown and described with reference to several preferred embodiments thereof, it will be understood by those skilled in the art that various changes in form and detail may be made without departing from the spirit and scope of the invention.

What is claimed is:

1. A superconductive magnet for use in magnetic resonance imaging and spectroscopy comprising:
   a coil form having a plurality of superconductive coils situated coaxially on the coil form spaced apart from one another; and
   a plurality of pairs of thermal bridges, each of said thermal bridges comprising a bar shaped section connecting a first and second end portion, said first end portion having a surface area greater than the second end portion, each of said pairs of thermal bridges situated between a respective pair of adjacent coils, said bar sections of each of the pairs extending in the direction of the magnet's field generated when the coils are energized, between the adjacent coils, said first end of one of said pair and the second end of the other of said pair in thermal contact with one of the adjacent pair of coils, said second end of one of said pair of thermal bridges and the first end of said other thermal bridge in thermal contact with the other coil of the adjacent pair, so that each thermal bridge of the pair acts as a heat flux amplifier in an opposite direction between the adjacent coils.

2. The superconductive magnet of claim 1 wherein one thermal bridge in each pair electrically connects an end of one coil winding to an end of the adjacent coil winding so that one thermal bridge of the pair also serves as a bus bar electrically connecting the coils together.

3. The superconductive magnet of claim 1 wherein said first end portion of said thermal bridge extends between the coil and the coil form.

4. The superconductive magnet of claim 1 wherein said second end portion of said thermal bridge abuts the edge of the coil.

5. The superconductive magnet of claim 1 wherein said thermal bridges are fabricated from high thermal diffusivity material selected from the group consisting of high purity silver, high purity copper, and high purity aluminum.

6. The superconductive magnet of claim 2 wherein said first end portion of said thermal bridge extends between the coil and the coil form.

7. The superconductive magnet of claim 2 wherein said second end portion of said thermal bridge abuts the edge of the coil.

8. The superconductive magnet of claim 2 wherein said thermal bridges are fabricated from high thermal diffusivity material selected from the group consisting of high purity copper, high purity silver, and high purity aluminum.

9. The superconductive magnet of claim 1 wherein the ends of said thermal bridge are electrically insulated from said coils.

10. The superconductive magnet of claim 1 wherein the circumferential extent of the second end portion of the thermal bridge is selected so that the length of time it takes for heat to travel from the center of the circumferentially extending end portion to one circumferential end is the same as the time it takes heat to go from the center of the circumferentially extending end portion to the superconductive winding the second end portion of the thermal bridge is in thermal contact with.

11. The superconductive magnet of claim 1 wherein the circumferential extent of the first end portion of the thermal bridge is selected so that the length of time it takes for heat to travel from the center of the circumferentially extending end portion to one circumferential end is the same as the time it takes heat to go from the center of the circumferentially extending end portion to the superconductive winding the second end portion of the thermal bridge is in thermal contact with.

12. A superconductive magnet for use in magnetic resonance imaging and spectroscopy comprising:
a cylindrical coil form having a plurality of superconductive coils situated coaxially on the coil form spaced apart from one another; and
a plurality of pairs of thermal bridges, each of said thermal bridges comprising a bar shaped section connecting a first and second end portion, said first end portion having a surface area greater than the second end portion, each of said pairs of thermal bridges situated between a respective pair of adjacent coils, said bar sections of each of the pairs extending axially between the adjacent coils, said first end of one of said pair and the second end of the other of said pair in thermal contact with one of the adjacent pair of coils, said second end of one of said pair of thermal bridges and the first end of said other thermal bridge in thermal contact with the other coil of the adjacent pair, so that each thermal bridge of the pair acts as a heat flux amplifier in an opposite direction between the adjacent coils.

13. A superconductive magnet comprising:
a coil form having a plurality of superconductive coils situated on the coil form spaced apart from one another; and
a plurality of pairs of thermal bridges, each of said thermal bridges comprising a bar shaped section connecting a first and second end portion, said first end portion having a surface area greater than the second end portion, each of said pairs of thermal bridges situated between a respective pair of adjacent coils, said bar sections of each of the pairs extending in the direction of the magnet's field generated when the coils are energized, between the adjacent coils, said first end of one of said pair and the second end of the other of said pair in thermal contact with one of the adjacent pair of coils, said second end of one of said pair of thermal bridges and the first end of said other thermal bridge in thermal contact with the other coil of the adjacent pair, so that each thermal bridge of the pair acts as a heat flux amplifier in an opposite direction between the adjacent coils.

14. The superconductive magnet of claim 13 wherein one thermal bridge in each pair electrically connects an end of one coil winding to an end of the adjacent coil winding so that one thermal bridge of the pair also serves as a bus bar electrically connecting the coils together.

15. The superconductive magnet of claim 13 wherein said first end portion of said thermal bridge extends between the coil and the coil form.

16. The superconductive magnet of claim 13 wherein said second end portion of said thermal bridge abuts the edge of the coil.

17. The superconductive magnet of claim 13 wherein said thermal bridges are fabricated from high thermal diffusivity material selected from the group consisting of high purity silver, high purity copper, and high purity aluminum.

18. The superconductive magnet of claim 14 wherein said first end portion of said thermal bridge extends between the coil and the coil form.

19. The superconductive magnet of claim 14 wherein said second end portion of said thermal bridge abuts the edge of the coil.

20. The superconductive magnet of claim 14 wherein said thermal bridges are fabricated from high thermal diffusivity material selected from the group consisting of high purity copper, high purity silver, and high purity aluminum.

21. The superconductive magnet of claim 13 wherein the ends of said thermal bridge are electrically insulated from said coils.

22. The superconductive magnet of claim 13 wherein the circumferential extent of the second end portion of the thermal bridge is selected so that the length of time it takes for heat to travel from the center of the circumferentially extending end portion to one circumferential end is the same as the time it takes heat to go from the center of the circumferentially extending end portion to the superconductive winding the second end portion of the thermal bridge is in thermal contact with.

23. The superconductive magnet of claim 13 wherein the circumferential extent of the first end portion of the thermal bridge is selected so that the length of time it takes for heat to travel from the center of the circumferentially extending end portion to one circumferential end is the same as the time it takes heat to go from the center of the circumferentially extending end portion to the superconductive winding the second end portion of the thermal bridge is in thermal contact with.

* * * * *